(12) United States Patent
Shen et al.

(10) Patent No.: US 8,229,039 B2
(45) Date of Patent: Jul. 24, 2012

(54) FLEXIBLE RATE MATCHING

(75) Inventors: Ba-Zhong Shen, Irvine, CA (US); Sirikiat Lek Ariyavisitakul, Alpharetta, GA (US); Mark Kent, Vista, CA (US); Tak K. Lee, Irvine, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 881 days.

(21) Appl. No.: 12/273,506

(22) Filed: Nov. 18, 2008

(65) Prior Publication Data
US 2009/0135965 A1    May 28, 2009

Related U.S. Application Data

(60) Provisional application No. 60/990,284, filed on Nov. 26, 2007.

(51) Int. Cl.
H04L 5/12       (2006.01)
H04L 23/02      (2006.01)
H04L 27/06      (2006.01)
H03M 13/00      (2006.01)
G06F 11/10      (2006.01)

(52) U.S. Cl. ........ 375/341; 375/259; 375/262; 714/758; 714/807

(58) Field of Classification Search ................. 235/492; 375/341, 259, 262; 714/758, 807
See application file for complete search history.

(56) References Cited

U.S. PATENT DOCUMENTS
2003/0076870 A1*   4/2003   Moon et al. .................. 375/130

OTHER PUBLICATIONS

ETSI TS 125 212 V7.6.0 (Oct. 2007), "Universal Mobile Telecommunications System (UMTS); Multiplexing and channel coding (FDD) (3GPP TS 25.212 version 7.6.0 Release 7)," Oct. 2007 (105 pages).

3GPP TSG RAN WG1 #50 meeting, R1-073470, Fujitsu, "Adoption of 2-stage Rate Matching and modified IR-HARQ," Athens, Greece, Aug. 20-24, 2007 (4 pages).
3GPP TSG RAN1 #51, R1-074566, Motorola, "On supporting 1st stage turbo code rate matching," Jeju, Korea, Nov. 5-9, 2007 (2 pages).
TSG-RAN WG1 #51, R1-075091, Ericsson, "On Support of two-stage Rate Matching," Jeju, Korea, Nov. 5-9, 2007 (9 pages).
3GPP TSG RAN1#51, R1-075094, Motorola, NSN, Nokia, Samsung, LGE, "Proposal for Limited Buffer (a.k.a. Stage 1) Rate Matching," Jeju, Korea, Nov. 5-9, 2007 (3 pages).
3GPP TSG RAN1#51, R1-075106, Motorola, NSN, Nokia, Samsung, Freescale, LGE, Texas Instruments, Marvell, "Proposal for Limited Buffer Rate Matching," Jeju, Korea, Nov. 5-9, 2007 (3 pages).

* cited by examiner

*Primary Examiner* — Michael G Lee
*Assistant Examiner* — Laura Gudorf
(74) *Attorney, Agent, or Firm* — Garlick & Markison; Shayne X. Short

(57) ABSTRACT

Flexible rate matching. No constraints or restrictions are placed on a sending communication device when effectuating rate matching. The receiving communication device is able to accommodate received transmissions of essentially any size (e.g., up to an entire turbo codeword that includes all systematic bits and all parity bits). The receiving communication device employs a relatively small-sized memory to ensure a lower cost, smaller sized communication device (e.g., handset or user equipment such as a personal wireless communication device). Moreover, incremental redundancy is achieved in which successive transmissions need not include repeated information therein (e.g., a second transmission need not include any repeated information from a first transmission). Only when reaching an end of a block of bits or codeword to be transmitted, and when wrap around at the end of such block of bits or codeword occurs, would any repeat of bits be incurred within a later transmission.

20 Claims, 14 Drawing Sheets

FLEXIBLE RATE MATCHING

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional Patent Application which is hereby incorporated herein by reference in its entirety and made part of the present U.S. Utility patent application for all purposes:

1. U.S. Provisional Application Ser. No. 60/990,284, entitled "Flexible rate matching," filed Nov. 26, 2007, pending.

BACKGROUND OF THE INVENTION

1. Technical Field of the Invention

The invention relates generally to communication systems; and, more particularly, it relates to performing rate matching of various communications between communication devices within such communication systems.

2. Description of Related Art

Data communication systems have been under continual development for many years. One such type of communication system that has been of significant interest lately is a communication system that employs iterative error correction codes. Of those, one particular type of communication system that has received interest in recent years has been one which employs turbo codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

Generally speaking, within the context of communication systems that employ coding, there is a first communication device at one end of a communication channel with encoder capability and second communication device at the other end of the communication channel with decoder capability. In many instances, one or both of these two communication devices includes encoder and decoder capability (e.g., within a bi-directional communication system).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Rate matching of communications between a first communication device and a second communication device is of concern in many communication systems that operate in accordance with certain communication protocols. One application of particular interest involves rate matching between a sending communication device (e.g., referred to as eNode B for 3GPP LTE [3rd Generation Partnership Project Long Term Evolution], which may also be viewed as being a base station side communication device) to a receiving communication device (e.g., referred to as UE for 3GPP LTE, which may also be viewed as being a user equipment or handset).

One design concern in certain communication systems is to ensure that a personal wireless communication device (e.g., user equipment or handset) does not necessitate a relatively or significantly large amount of memory therein to effectuate decoding of received signals. Memory can be one of the more expensive (and sometimes real estate consumptive) components within a personal wireless communication device (e.g., user equipment or handset). Much effort has been directed lately to find ways to accommodate or overcome the need to have a relatively or significantly large amount of memory within a user equipment or handset.

The number of bits being sent from the first communication device to the second communication device may not be the same for various transmissions. Particularly within applications operating in accordance with some form or re-transmission (e.g., HARQ (Hybrid Automatic Retransmission Request)), the various transmissions therein may be of different size (number of bits), different code rates, different modulation types, etc. One manner in which rate matching may be performed is to use a stage rate matching approach. However, this approach necessitates a reduction in the size of the transmissions sent from the sending communication device.

A novel approach is presented herein that places no restriction on a sending communication device with regards to the size of a transmission block that may be sent from the sending communication device to a receiving communication device. In contradistinction to other approaches which minimize the size of transmissions sent from the sending communication device so that the receiving communication device can properly process them, the novel approach presented herein employs a receiving communication device that can accommodate any sized transmission while also using a relatively small amount of memory. Certain procedures may be employed to accommodate overflow of this relatively small amount of memory in those few instances when it may occur. Generally speaking, the amount of time in which memory overflow may occur is very, very small.

Figure 1:
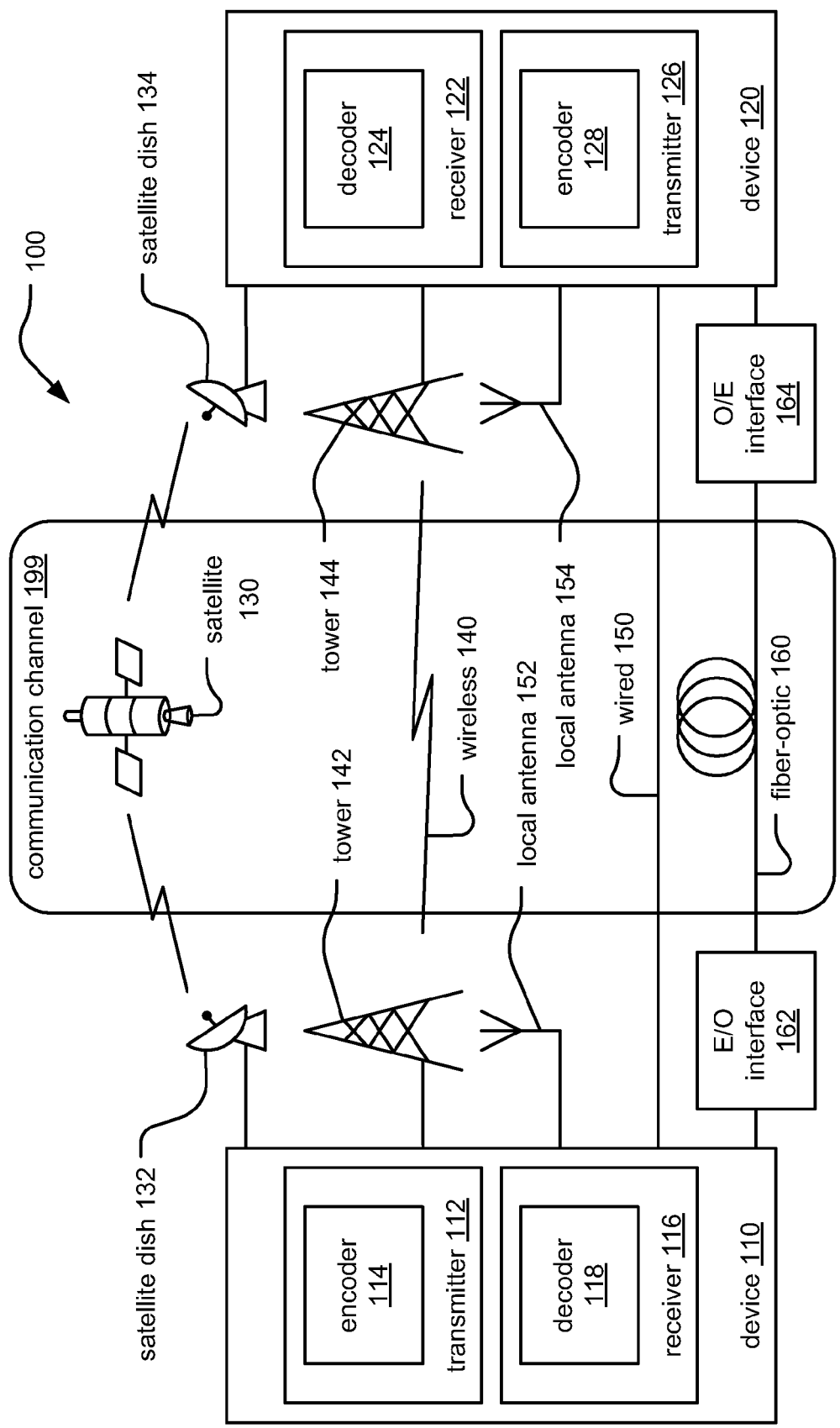
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
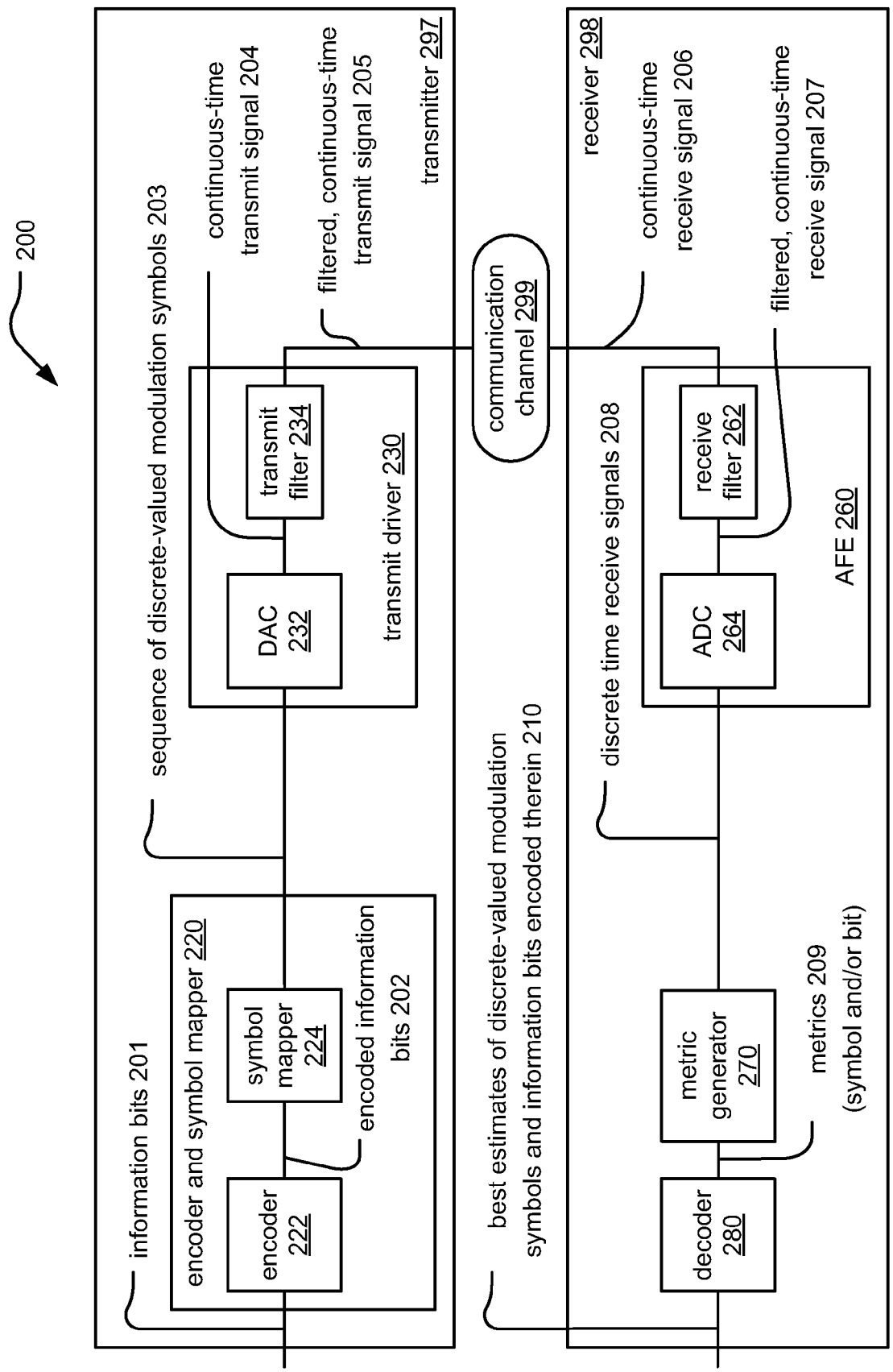

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 (e.g., a cellular communication system as one example) using towers 142 and 144 and/or local antennae 152 and 154, a wired communication channel 150 (e.g., an Ethernet communication system as one example), and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter side of the communication channel and a decoder at the receiver side of the communication channel. Either one or both of the device 110 and the device 120 may be a personal wireless communication device (e.g., user equipment or handset such as referred to in 3GPP LTE). Moreover, either one or both of the device 110 and the device 120 may be a base station side communication device (e.g., eNode B such as referred to in 3GPP LTE).

In some contexts (e.g., a hard disk drive (HDD) system in which information is written to and read from the storage media of the HDD), both the encoder and decoder can be situated on the same side of the read channel (which is that the communication channel coupling to the media is oftentimes referred as).

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention.

Various types of coded signals can be employed in this embodiment as well as within other embodiments as well, including uncoded signals, turbo encoded signals, turbo trellis coded modulation (TTCM) encoded signals, and/or cyclic redundancy check (CRC) encoded signals, among just some types of signals that can be employed in accordance with certain aspects of the invention.

Figure 3:
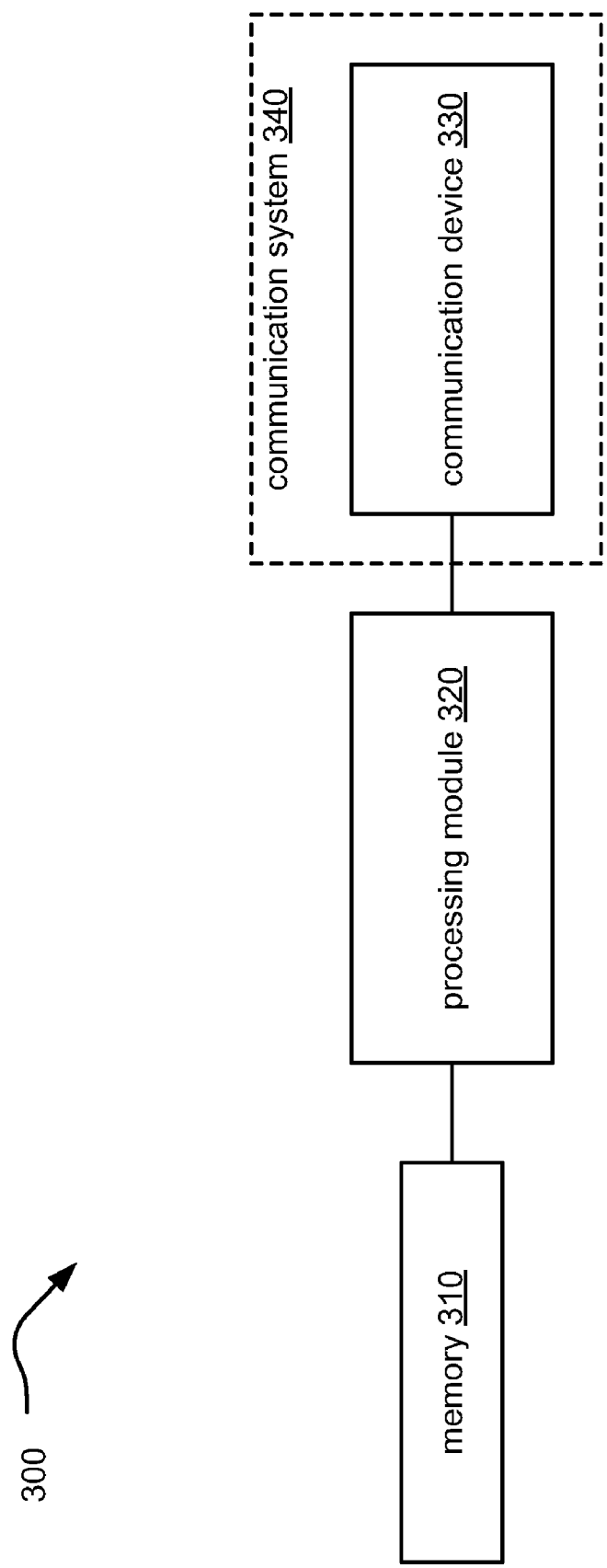
FIG. 3 illustrates an embodiment of an apparatus that is operable to be implemented within a communication system.

FIG. 3 illustrates an embodiment of an apparatus 300 that is operable to be implemented within a communication system. The apparatus 300 includes a processing module 320, and a memory 310. The memory 310 is coupled to the processing module, and the memory 310 is operable to store operational instructions that enable the processing module 320 to perform a variety of functions. The processing module 320 is operable to perform and/or direct the manner in which encoding and/or decoding processing is to be performed in accordance with any embodiment described herein, or any equivalent thereof.

The processing module 320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which the encoding and/or decoding processing is to be performed can be provided from the apparatus 300 to a communication system 340 that is operable to employ and perform a particular type of rate matching and/or turbo code. For example, one possible embodiment employs a particular type of rate matching and/or a particular turbo code corresponding to the manner in which the encoding and/or decoding processing is to be performed can also be provided from the processing module 320 to any of a variety of communication devices 330 implemented within the communication system 340 as well. In addition, similar information can also be provided from the processing module 320 to any of a variety of communication devices 330 implemented within the communication system 340 (e.g., within an embodiment that includes multiple communication devices).

If desired, the apparatus 320 can be designed to generate multiple means of performing encoding and/or decoding in accordance with multiple needs and/or desires as well. In some embodiments, the processing module 320 can selectively provide different information (e.g., corresponding to embodiments of turbo encoding and/or decoding, rate matching, etc.) to different communication devices and/or communication systems. That way, different communication links between different communication devices can employ different codes, rate matching, and/or means by which to perform decoding. Clearly, the processing module 320 can also provide the same information to each of different communication devices and/or communication systems as well without departing from the scope and spirit of the invention.

Figure 4:
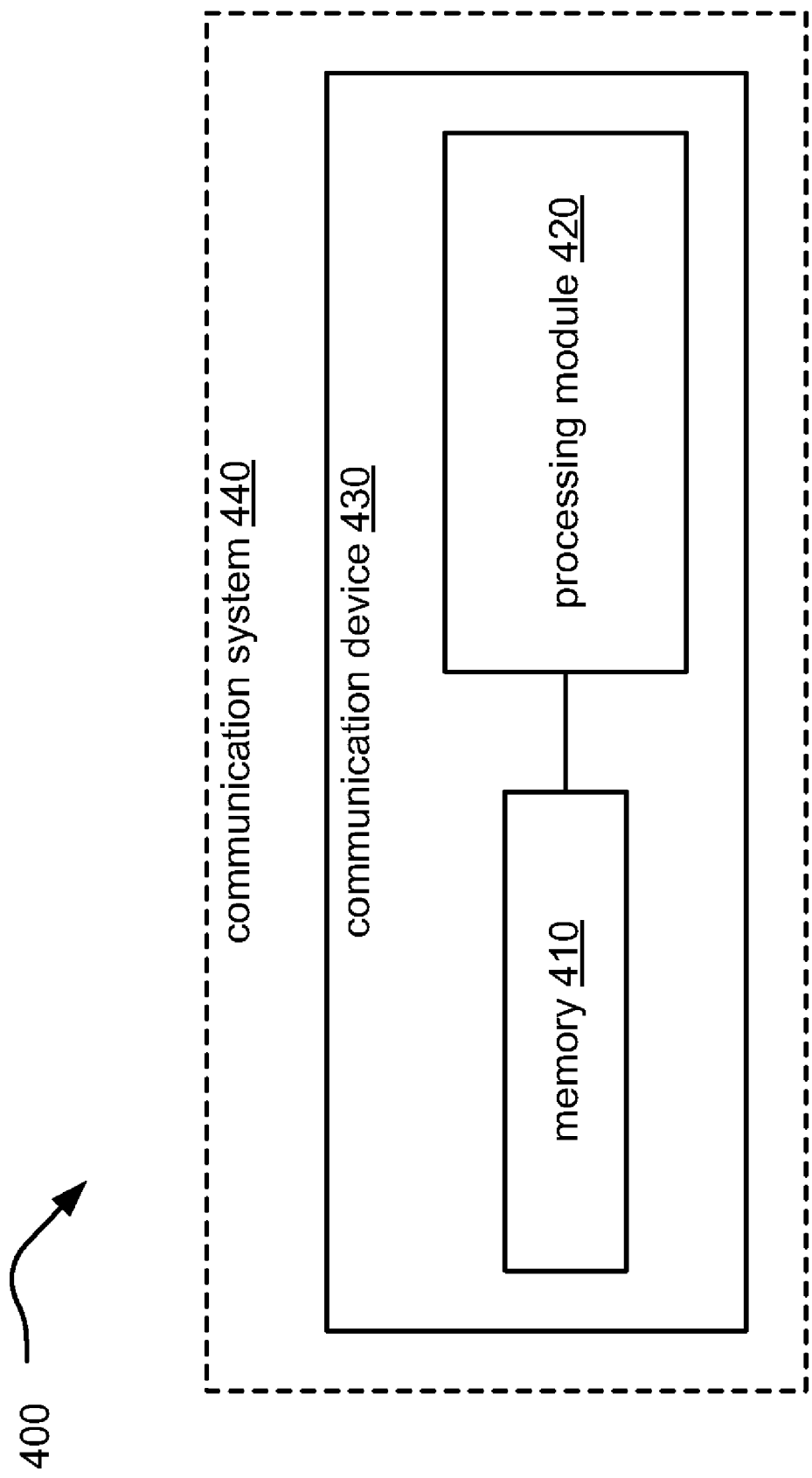
FIG. 4 illustrates an alternative embodiment of an apparatus that is operable to be implemented within a communication system.

FIG. 4 illustrates an alternative embodiment of an apparatus 400 that is operable to be implemented within a communication system. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 420) can be implemented as an apparatus capable to perform any of the functionality of any of the various modules and/or functional blocks described herein. For example, the processing module 420 (serviced by the memory 420) can be implemented as an apparatus capable to perform and/or direct the manner in which rate matching and/or turbo encoding processing and/or turbo decoding processing is to be performed in accordance with any embodiment described herein, or any equivalent thereof.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the processing module 420 and/or memory 410 can be implemented within any of a variety of communication systems 440 as well. It is also noted that various embodiments of encoding and/or decoding processing such as those presented herein, and equivalents thereof, may be applied to many types of communication systems and/or communication devices.

Figure 5:
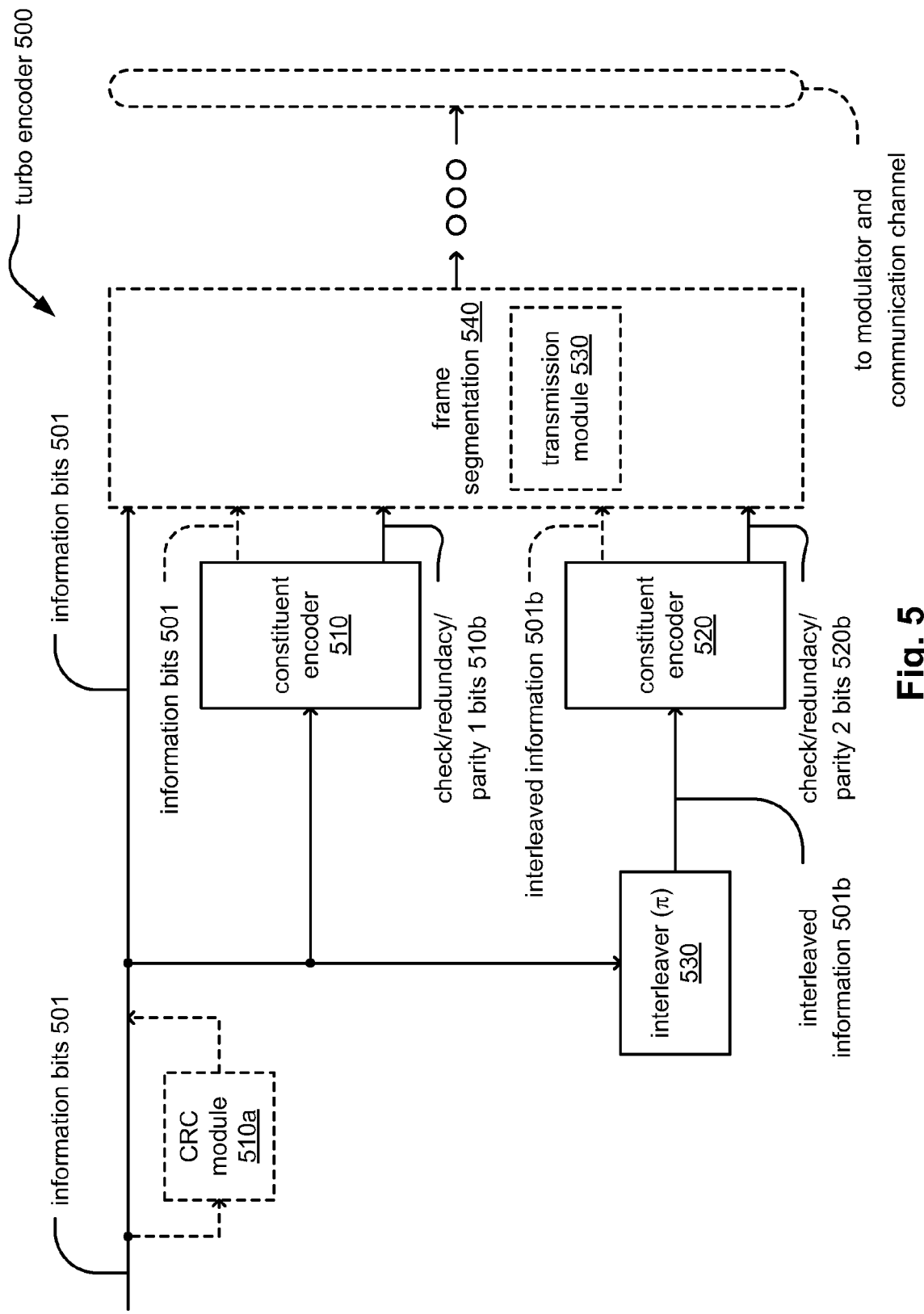
FIG. 5 and FIG. 6 illustrate various embodiments of turbo encoding modules or turbo encoders such as may be included within a transmitter communication device or transmitter module within a transceiver communication device.
Figure 6:
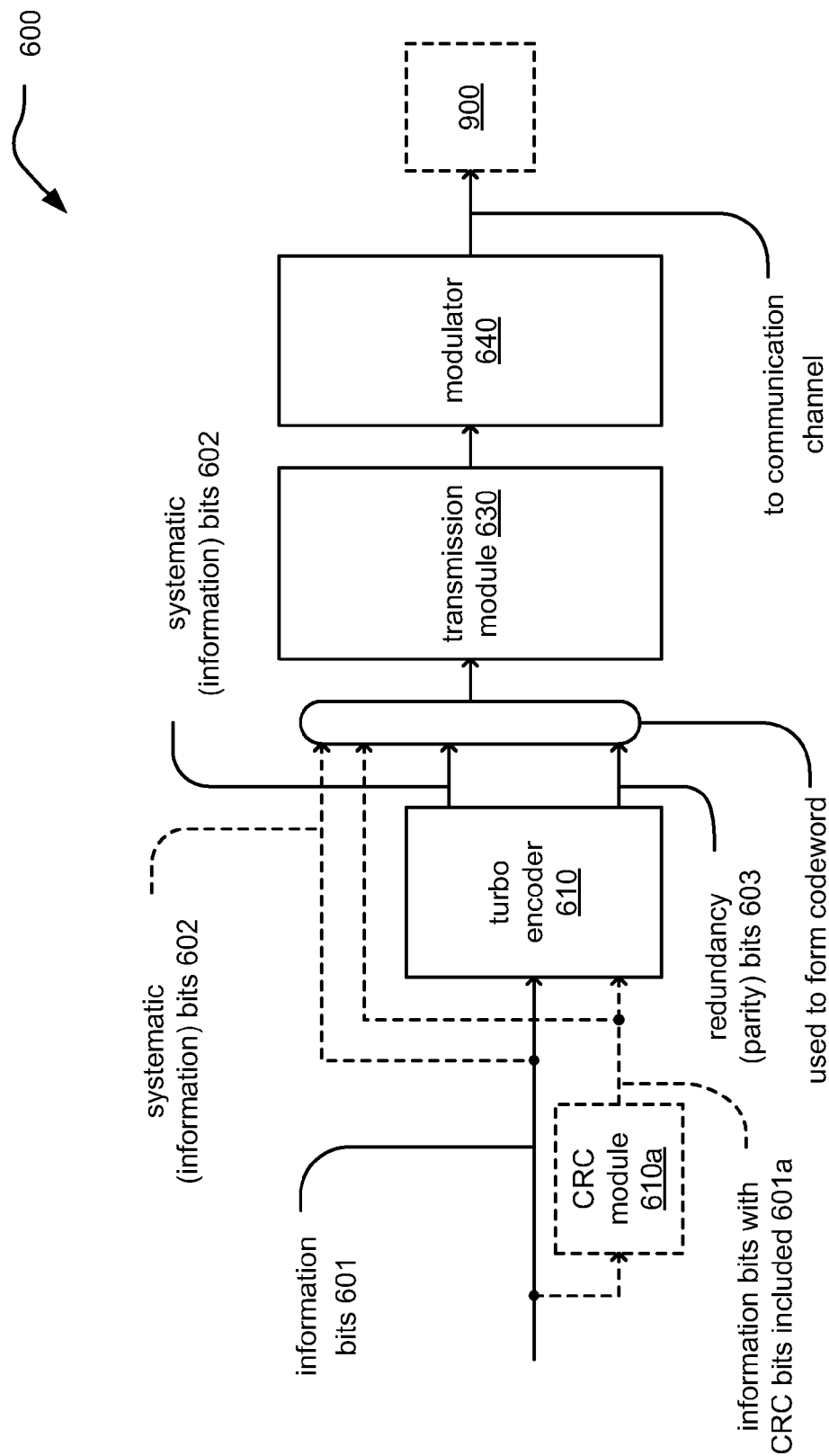

FIG. 5 and FIG. 6 illustrate various embodiments of turbo encoding modules or turbo encoders 500 and 600, respectively, such as may be included within a transmitter communication device or transmitter module within a transceiver communication device.

FIG. 5 illustrates an embodiment of a turbo encoder 500. Information bits are provided to an interleaver ($\pi$) module 530 that is operable to generate interleaved information 501b. The particular interleave ($\pi$) employed by the interleaver ($\pi$) module 530 can be a quadratic polynomial permutation (QPP) interleave ($\pi$) in some embodiments. Alternatively, other desired interleaves ($\pi$) can be employed by the interleaver ($\pi$) module 530 without departing from the scope and spirit of the invention.

These information bits 501 are also passed to a first constituent encoder 510 from which both the information bits 501 as well as check/redundancy/parity 1 bits 510b are output there from.

The interleaved information 501b output from the interleaver ($\pi$) module 530 is passed to a second constituent encoder 520 from which both the interleaved information 501b as well as check/redundancy/parity 2 bits 520b are output there from.

In the art, the parity bits output from a turbo encoder are sometimes referred to as check bits, parity bits, and/or redundancy bits. Moreover, the information bits output from a turbo encoder are sometimes referred to as the information bits (i.e., the very same as was provided to the turbo encoder) and also as systematic bits (e.g., in the context of a systematic encoder that, when encoding information bits, outputs those same information bits as well as check/redundancy/parity bits). Herein, parity bits and/or redundancy bits is oftentimes employed for reference to these check/redundancy/parity bits output from a turbo encoder, and information bits are oftentimes employed for reference to these information/systematic bits output from such a turbo encoder and/or constituent encoder implemented therein.

Each of the information bits 501, the parity 1 bits 510b, and the parity 2 bits 520b is provided to a frame segmentation module 540. The frame segmentation module 540 may itself perform construction of a transmission block to be transmitted from a communication device in which the turbo encoder 500 may be implemented. If desired, a separate transmission module 530 implemented within the frame segmentation module 540 may perform these functions.

Various other components can also be situated as part of or after the frame segmentation module 540 to assist in the generation of an encoded block that may then be passed to a modulator that processes the bit stream output from the frame segmentation module 540 for generating a continuous time signal that comports with a given communication channel. Such operations as may be performed by a modulator can include any of symbol mapping where the symbols are mapped according to the appropriate modulation (constellation and mapping), digital to analog conversion (DAC), symbol mapping, gain adjustment, filtering, etc. As will be understood by the reader, any of a variety of front-end type operations may be performed to generate a continuous-time signal whose format comports with a communication channel into which the signal is to be launched.

FIG. 6 illustrates an embodiment of a turbo encoding module 600. Information bits 601 are also passed to the turbo encoder 610 from which both the systematic (information) bits 602 (i.e., which are the very same as the information bits 601) as well as redundancy (parity) bits 603 are output there from. If desired, a cyclic redundancy check (CRC) module 610a, situated before the turbo encoder 610, processes the input information bits 601 (e.g., turbo block) thereby generating CRC bits which may be appended to the information bits 601. In such case, each turbo block would have its own corresponding CRC bits. In other embodiments, another level of CRC may be employed in which all of the turbo blocks (with their corresponding CRC bits) undergo CRC processing to generate a second level of CRC as well.

Clearly, the CRC bits may also be placed in other locations within the information bits 601 besides only being appended thereto. In this instance in which the CRC module 610a is implemented, the modified information bits 601 (i.e., with the CRC bits therein) is what is passed to the turbo encoder 610 and what undergoes turbo encoding.

In some embodiments, the information bits 601 may also be passed by the turbo encoding module 600 to generate the systematic (information) bits 602 directly without needing to extract them from the turbo encoding module 600. As the reader will understand in the context of systematic codes, the information bits within a codeword output there from includes all of the information bits 601 provided to the encoder. However, in any case, it is noted that the information bits 601 nonetheless need to be provided to the turbo encoder 610, so that the redundancy (parity) bits 603 may be generated there from.

A codeword is formed from the information bits 601 (or the systematic (information) bits 602, which are the same bits) and the redundancy (parity) bits 603. Generally speaking, the codeword may be viewed as being the information bits 601 (or the systematic (information) bits 602) followed by the redundancy (parity) bits 603.

A transmission module 630 operates on the codeword to form a transmission block. There are a variety of ways in which the transmission block may be formed. For example, in one embodiment, the transmission module 630 forms a transmission block from selected bits of the codeword (e.g., selected information bits and/or selected redundancy (parity) bits). In one embodiment, the transmission block may include one occurrence of each information bit of the information bits 601/602 and one occurrence of each parity bit of a selected subset of the redundancy (parity) bits 603 (i.e., it does not include all of the redundancy (parity) bits 603). Clearly, other desired combinations of selected information bits and/or selected redundancy (parity) bits may be employed to generate a transmission block to be output from the transmission module 630.

A modulator 640 then processes the generated transmission block thereby generating a continuous time signal that is launched into a communication channel. Another communication device, depicted by reference numeral 900 and as described in FIG. 9, may be situated at the other end of the communication channel. As mentioned above, there are a variety of operations that may be performed within the modulator 640. Such operations as may be performed by a modulator can include any of symbol mapping where the symbols are mapped according to the appropriate modulation (constellation and mapping), digital to analog conversion (DAC), symbol mapping, gain adjustment, filtering, etc. As will be understood by the reader, any of a variety of front-end type operations may be performed to generate a continuous-time signal whose format comports with a communication channel into which the signal is to be launched.

The following describes one possible manner by which soft buffer rate matching may be performed to govern communications between two separate communication devices coupled together via some type of communication channel.

With reference to the 3GPP LTE [3rd Generation Partnership Project Long Term Evolution], it has been decided in 3GPP LTE Release 8 (e.g., see reference [1]) that the transport block (TB) rate is 2 TB/msec (milli-second), and the number of HARQ (Hybrid Automatic Retransmission Request) processes is 8. With the circular buffer rate matching approach adopted in the 3GPP LTE Release 8, the maximum size of the downlink soft buffer (e.g., of the UE (user equipment or handset)) can be calculated as indicated below in Table 1.

TABLE 1

| Parameter | Units | UE Category | | | | |
| --- | --- | --- | --- | --- | --- | --- |
| | | Class 1 | Class 2 | Class 3 | Class 4 | Class 5 |
| Peak data rate | Mbps | 5 | 50 | 100 | 150 | 300 |
| # bits per TB | bits | 2,500 | 25,000 | 50,000 | 75,000 | 150,000 |
| # CB per TB | CBs | 1 | 5 | 9 | 13 | 25 |
| Small CB Size | bits | N/A | 4,992 | 5,568 | 5,760 | 6,016 |
| Large CB Size | bits | 2,560 | 5,056 | 5,632 | 5,824 | 6,080 |
| Max Total Soft buffer | Locations | 121,152 | 1,206,912 | 2,411,520 | 3,616,128 | 7,229,952 |

In the table, CB means turbo code block (CB). It is noted that one TB may contain multiple CBs, and various CBs within the TB may be of different size (e.g., there might be at least two different sizes of CBs in one given TB). The soft buffer is used to save soft information symbols (e.g. log likelihood ratios (LLRs) in some embodiments) for all of the TBs. The soft information will be used for turbo decoding after re-transmission. One location in the soft buffer may contain m bits, where m is an integer.

Considering the UE category 4 (e.g., see second to last column of Table 1 above), the maximal size of the soft buffer is 3,616,128 locations. Such a large amount of memory may incur significant cost in hardware such as in a personal wireless communication device (e.g., such as a UE or handset in 3GPP LTE).

In an effort to reduce the size of the soft buffer required, in previous 3GPP standards, such as HSDPA (e.g., see reference [2]), and in other proposals for LTE (e.g., see references [3-5]), a 2 stage rate matching approach is used. Basically, in accordance with this 2 stage rate matching approach, the first stage rate matching will reduce the buffer size, and the second rate matching is for matching the rate with the reduced soft buffer. In the fashion of circular buffer rate matching (CBRM) approach described in reference [1], the 2 stage rate matching can be considered to be limited buffer rate matching (LBRM).

Corresponding to this soft buffer is a buffer of coded bits on the encoding side (called eNode B for LTE, which may also be viewed as being the base station side) which usually is a base station for downlink. The size of this buffer normally is k times the number of systematic bits for a rate 1/k turbo code (e.g., in 3GPP LTE [1] k=3). The 2 stage rate matching scheme reduces the size of this buffer on the transmitting side. Thus, the stripped or discarded part of the coded bits will never be transmitted or sent to the receiving communication device (e.g., handset or UE) in the first transmission or in any subsequent re-transmissions. This inherently weakens the power of the original code and will hurt the performance of the whole system.

A novel approach to performing rate matching is presented herein. Generally, this may be referred to as flexible rate matching. There are no constraints or restrictions placed on a sending communication device when effectuating rate matching in accordance with this novel approach presented herein.

With reference to the 3GPP LTE, there is no reduction of the coded bits buffer on the transmitting communication device (e.g., the eNode B device as referred to in 3GPP LTE). Therefore, there is no restriction whatsoever on the bits sent by eNode B, and this will therefore retain the full power of the turbo code in reference [1]. Compare this to the less than ideal 2 stage rate matching approach mentioned above in which the power of the code is inherently degraded.

Also, in a receiving communication device (e.g., the decoder side within a UE or handset communication device as referred to in 3GPP LTE), some flexible rate matching approaches can be employed for better managing the reduced memory storage area therein.

Again referring to 3GPP LTE, using this novel approach of rate matching, there is no need to specify a 2 stage rate matching in the 3GPP LTE standard at all.

Figure 7:
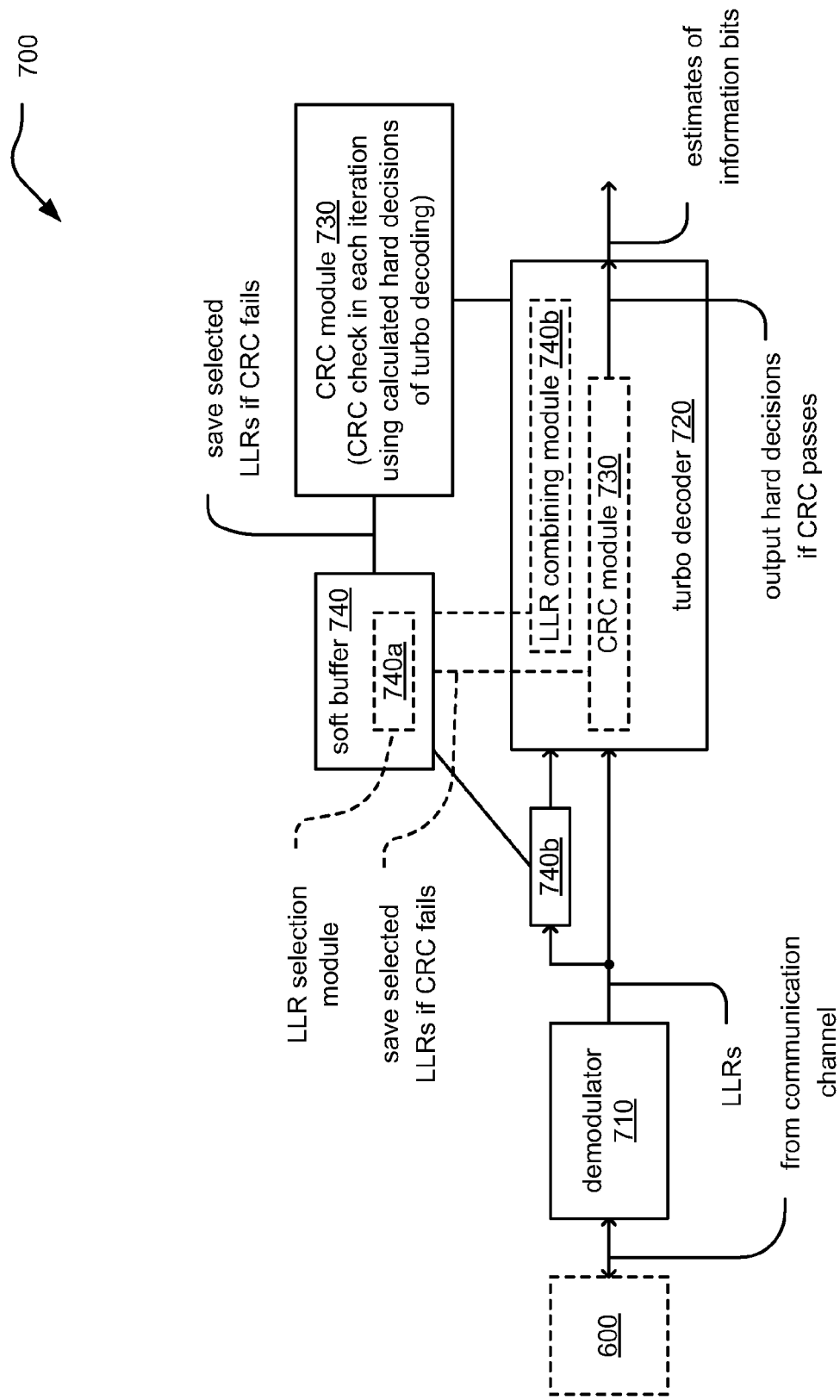
FIG. 7 illustrates an embodiment of a turbo decoding module such as may be included within a receiver communication device or receiver module within a transceiver communication device.

FIG. 7 illustrates an embodiment of a turbo decoding module 700 such as may be included within a receiver communication device or receiver module within a transceiver communication device. A signal is received from a communication channel. This signal may be one that is generated in accordance with a turbo encoding module as implemented within a communication device (e.g., such as turbo encoding module 600 of FIG. 6).

Regardless of the particular implementation of the device that generates the signal that is transmitted to the turbo decoding module 700 of this diagram, a demodulator 710 processes the signal thereby generating a plurality of LLRs (log likelihood ratio values). These LLRs are then passed to a turbo decoder 720 that processes the plurality of LLRs thereby generating a plurality of hard decisions. Once the hard decisions are available for a given decoding iteration, a cyclic redundancy check (CRC) module 730 performs a CRC check on the plurality of hard decisions. The CRC module 730 may be implemented within the turbo decoder 720 itself, or it may alternatively be implemented externally to the turbo decoder 720 in which the hard decisions will then need to be provided to the CRC module 730.

When the CRC check passes, the turbo decoder 720 outputs the plurality of hard decisions as the estimates of the information bits encoded within the signal. However, when the CRC check fails, a soft buffer 740, capable to store only a predetermined number of LLRs, selectively stores only a subset of LLRs selected from the plurality of LLRs. An LLR selection module 740a may be implemented to perform the partitioning and/or decomposing (which may merely be logical partitioning and/or decomposing) of the locations within the soft buffer 740. This LLR selection module 740a may be implemented as intelligence within the soft buffer 740, or it may alternatively be implemented externally to the soft buffer 740. There are a variety of ways in which the LLR selection module 740a can selectively store the subset of LLRs. For example, the subset of LLRs may be a subset of consecutive LLRs within the calculated plurality of LLRs (e.g., the first consecutive X number of LLRs, where X is an integer). Alternatively, the LLR selection module 740a may select the subset of LLRs from the plurality of LLRs in accordance with a predetermined, non-consecutive pattern (e.g., every other LLR, every LLR in an odd or even location, according to some function, etc).

Moreover, it is noted that when the CRC check fails, as determined by the CRC module 730, a communication device that includes the turbo decoding module 700 may then request transmission of another signal from a sending communication device that provided the original signal to the communication device that includes the turbo decoding module 700. In such a case, the demodulator 710 then processes the additional signal thereby generating another plurality of LLRs. The turbo decoder 720 then processes these additional LLRs thereby generating another plurality of hard decisions. It is noted that the number of bits within each of the first and second signal transmitted may be different, and as such, the number of LLRs generated from each of the signals may be different as well.

As mentioned above, when the CRC fails, selected LLRs are saved in the soft buffer 740. When another signal (e.g., a second signal) is received and another group of LLRs is generated, then an LLR combining module 740b may be implemented to update at least one LLR of the previously calculated and stored LLRs using at least one LLR of the newly/recently calculated LLRs (e.g., from the second or later received signal). The turbo decoder 720 may then generate an additional plurality of hard decisions, or it may re-generate (or update) the previously generated plurality of hard decisions. The updating or combining of a previously calculated LLR with a newly/recently calculated LLR may be adding them together thereby generating the latest LLR.

The turbo decoding module 700 may be performed in a wide variety of communication devices, including those that may be implemented within any one of a satellite communication system, a wireless communication system, a wired communication system, and/or a fiber-optic communication system. Clearly, certain communication system types may include some satellite components, some wired components, some wireless components, some fiber-optic or optical components, etc.

Figure 8:
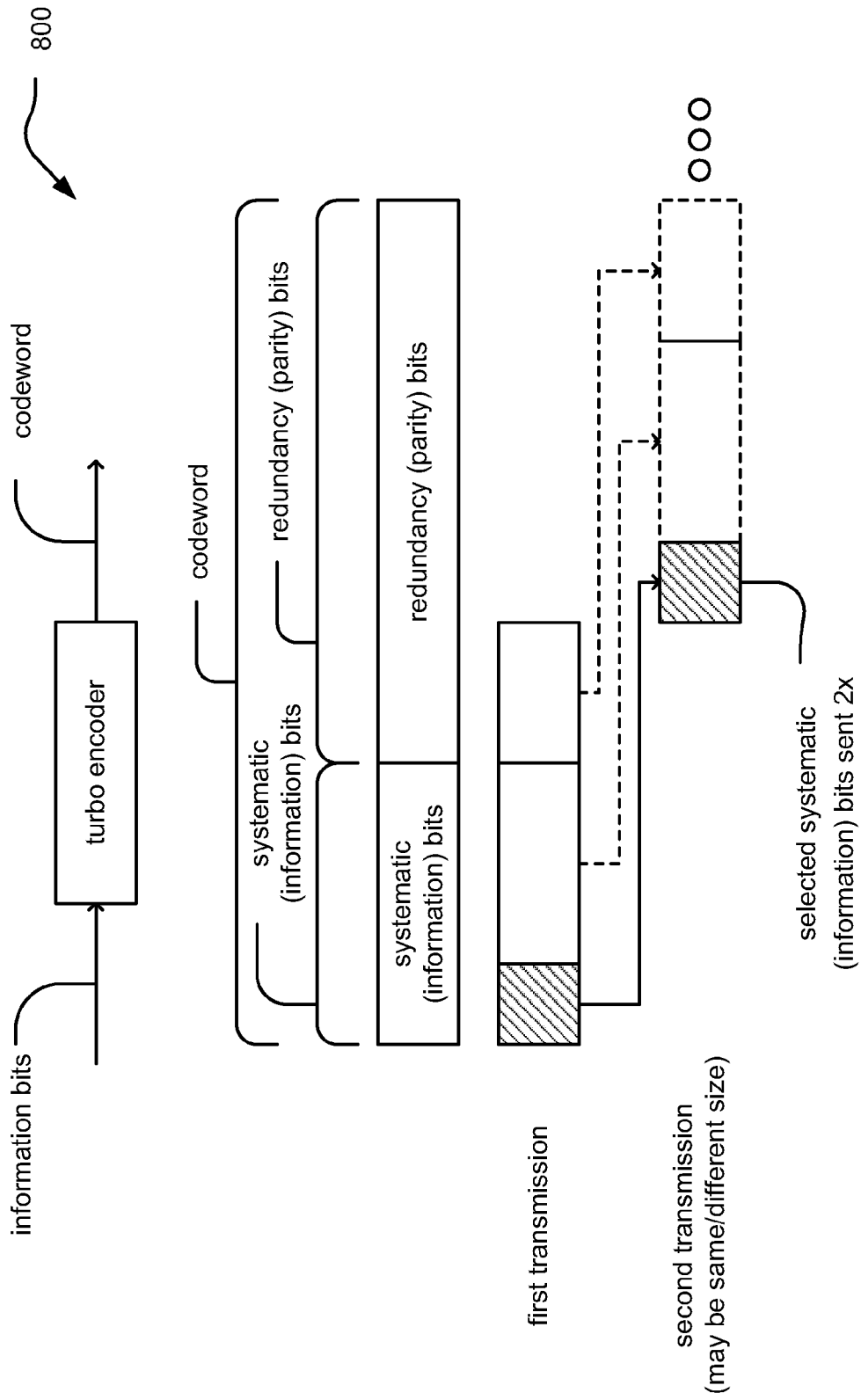
FIG. 8 illustrates an embodiment of bits sent out following 2 stage rate matching restriction.

FIG. 8 illustrates an embodiment 800 of bits sent out following 2 stage rate matching restriction.

With the rate 1/3 mother turbo code adopted in reference [1], the coded TB size is 3 times the size of the TB size with corresponding CRC bits. The size of TB with CRC may be depicted as N, where N is an integer. If it is supposed that the transmitted code rate is r, then the number of bits sent out by a transmitting communication device (e.g., eNode B in context of 3GPP LTE) send out is N/3r.

If the 2 stage rate matching (or limited rate matching) is specified and employed, then say only one-half of the size of the original soft buffer can be used within the transmitting communication device. The transmitting communication device then can only send up to one-half the number of coded bits. This clearly will reduce the full error correction capability of the code.

If the transmitting communication device does not want to send repeated bits, then the lowest rate that the transmitting communication device can take is r=2/3. Otherwise in the case that CQI (Channel Quality Index) allows code rate r<2/3, and the transmitting communication device inherently needs to repeat some information bits. As can be seen in FIG. 8, a second transmission also includes selected systematic (information) bits that were already transmitted within a first transmission.

Figure 9:
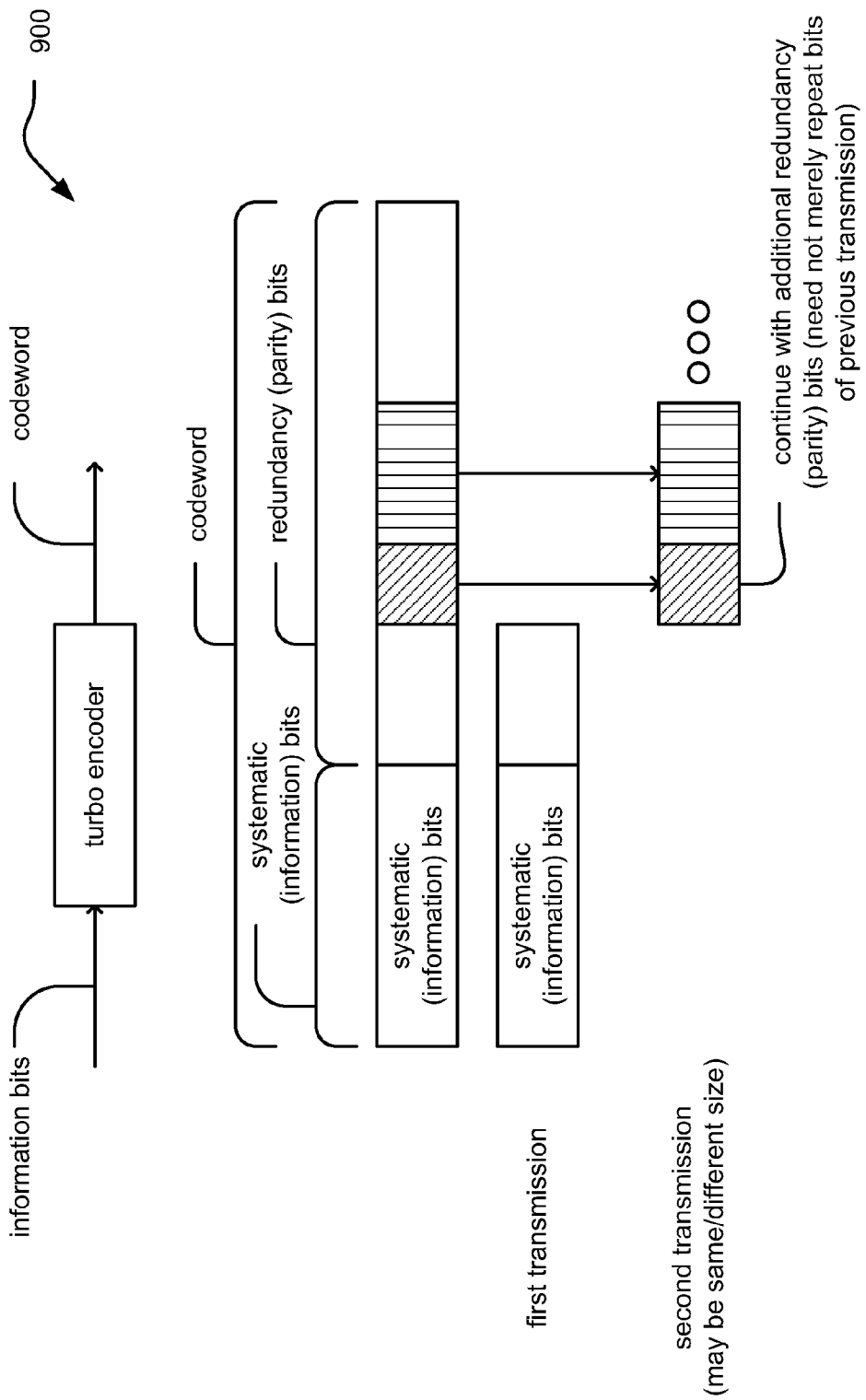
FIG. 9 illustrates an embodiment of bits sent out without the 2 stage rate matching restriction.

FIG. 9 illustrates an embodiment 900 of bits sent out without the 2 stage rate matching restriction. The tops of each of FIG. 8 and FIG. 9 show the codeword stream of a rate 1/3 mother code (e.g., as generated by a turbo encoder that encodes information bits, and it is also noted that the information bits provided to the turbo encoder may already include certain CRC bits therein).

If CQI allows code rate r<2/3, then FIG. 8 shows the stream that a transmitting communication device (e.g., eNode B) will send out to a receiving communication device (e.g., UE) under the 2 stage rate matching defined in HSDPA as in reference [2], i.e. at least a portion of the second transmission includes some of the very same bits as were transmitted in the first transmission.

Although a receiving communication device (e.g., UE) can use the Chase combining method to decode this stream, performance will be worse than what is proposed using the novel rate matching approach presented herein that places no constraint on the number of bits that may be transmitted from a transmitting communication device (e.g., eNode B).

FIG. 9, which contains no repeated stream, will clearly provide a better performance than that of FIG. 8. The means employed within FIG. 9 provides for a better performance than FIG. 8, in that, no repeated information is sent (i.e., it provides more redundancy information than FIG. 8 and less real coded information is stripped or cut out). This inherently increases the error correction capability of the code. In other words, more of the power of the turbo decoding can be employed since there is less real coded information stripped or cut out. This clearly provides for a better performance than the 2 stage rate matching employed in FIG. 8.

As mentioned above, the novel rate matching approaches presented herein employs for a relatively small amount of memory within a receiving communication device (e.g., UE).

There may be instances, though few and seldom, in which this smaller memory may overflow given that there is no restriction on the number of bits that may be transmitted from a transmitting communication device (e.g., eNode B). Effective management of these possible situations (though their occurrence will be very small) is addressed below. When the size of the soft buffer within a receiving communication device (e.g., UE) is reduced, the following approaches effectively deal with the possible overflow situation.

When a first transmission fails after decoding (i.e. CRC failed after turbo decoding), the receiving communication device (e.g., UE) will save the soft information symbols (e.g., LLRs) to the soft buffer and send a NACK (negative acknowledgement) to the transmitting communication device (e.g., eNode B) and request re-transmission of the failed TBs. This procedure is generally referred to as HARQ.

For each stream, the physical-layer (PHY) HARQ processing and use of multiple HARQ processes are identical to the single stream. After decoding for each stream, the receiving communication device (e.g., UE) will send one ACK/NACK to the transmitting communication device (e.g., eNode B). It is noted that ACK means acknowledgement. Since the number of HARQ processors is defined to be 8 in reference [1], and in every one millisecond, 2 TBs will be transmitted, the maximal size of the soft buffer is the size of 16 coded TBs (CTB).

Suppose the receiving communication device (e.g., UE) wants to reduce the soft buffer size of 16 coded TBs to k (k<16) coded TBs, and also suppose the average code rate of all 16 TBs is R, then when $R \geq 16k/3$ all the soft information can be saved to the soft buffer of k CTB size. For example, if we take k=8, i.e. reducing half of the soft buffer size, then when $R \geq 2/3$ all the soft information can be saved.

When R<16k/3, let us denote average TB error rate by E which is also the probability of the receiving communication device (e.g., UE) send a NACK, then $$Pr(\text{overflow for } SB \text{ of } k \text{ } TBs) = \sum_{i=k}^{15} \binom{16}{i+1} E^{i+1}(1-E)^{16-i-1}$$

The following table gives numerical values.

| E | 1% | 2% | 3% | 5% | 10% |
|---|---|---|---|---|---|
| Pr(Overflow for SB of 16 CTBs) | 0.00E+00 | 0.00E+00 | 0.00E+00 | 0.00E+00 | 0.00E+00 |
| Pr(Overflow for SB of 15 CTBs) | 1.00E−32 | 6.55E−28 | 4.30E−25 | 1.53E−21 | 1.00E−16 |
| Pr(Overflow for SB of 14 CTBs) | 1.59E−29 | 5.14E−25 | 2.23E−22 | 4.65E−19 | 1.45E−14 |
| Pr(Overflow for SB of 13 CTBs) | 1.18E−26 | 1.89E−22 | 5.42E−20 | 6.66E−17 | 9.87E−13 |
| Pr(Overflow for SB of 12 CTBs) | 5.45E−24 | 4.61E−20 | 8.20E−18 | 5.93E−15 | 4.18E−11 |
| Pr(Overflow for SB of 11 CTBs) | 1.75E−21 | 6.92E−18 | 8.64E−16 | 3.68E−13 | 1.24E−09 |
| Pr(Overflow for SB of 10 CTBs) | 4.17E−19 | 8.16E−16 | 6.73E−14 | 1.69E−11 | 2.70E−08 |
| Pr(Overflow for SB of 9 CTBs) | 7.58E−17 | 7.35E−14 | 4.01E−12 | 5.92E−10 | 4.53E−07 |
| Pr(Overflow for SB of 8 CTBs) | 1.07E−14 | 5.16E−12 | 1.86E−10 | 1.62E−08 | 5.92E−06 |

The block error rate for turbo coding in LTE is aim to $E \leq 10\%$ after decoding. Therefore, if the receiving communication device (e.g., UE) would like to reduce the size of its soft buffer by 50%, then the probability that receiving communication device (e.g., UE) does not have enough memory to save soft information symbols for the next re-transmission is about 6E-06 (i.e., a probability of approximately 6 out of 1,000,000). Therefore, most likely only half of 16 CTBs size of soft buffer is needed. However, for this, the receiving communication device (e.g., UE) records the address of where i-th CTB soft-information is saved.

Figure 10:
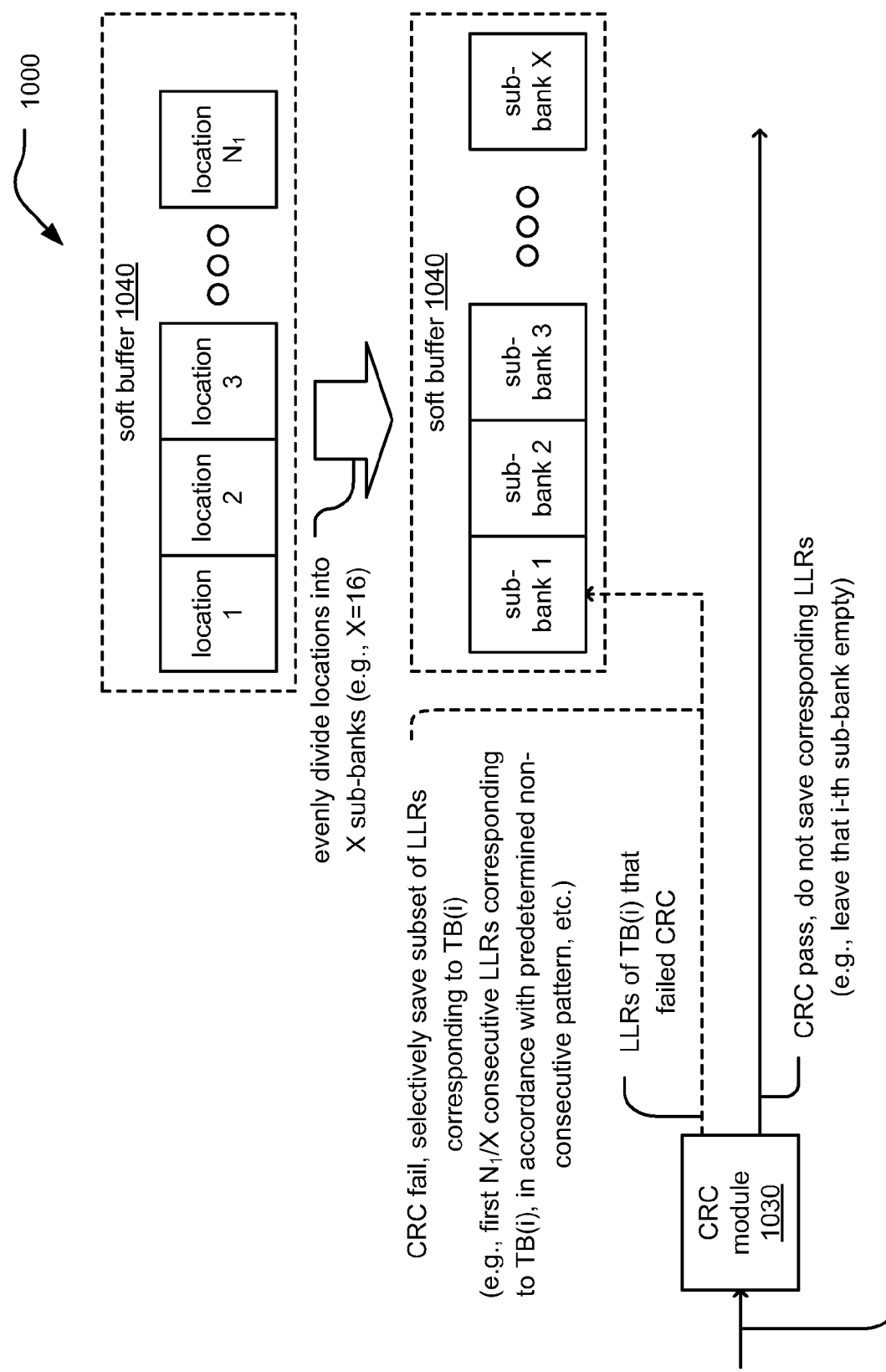
FIG. 10 illustrates an embodiment of allocating a relatively small sized memory device for storing of soft information (e.g., LLRs).

FIG. 10 illustrates an embodiment 1000 of allocating a relatively small sized memory device for storing of soft information (e.g., LLRs).

As can clearly be seen above, in most cases a receiving communication device (e.g., UE) does have enough space to save the soft information (e.g., LLRs) of failed TBs (e.g., as determined by CRC check) even when the soft buffer size is reduced. However, the probability of overflow is not absolutely zero for all cases. Therefore, the following approaches provide means by which these very few instances of overflow may be handled effectively. When overflow happens, one of the following procedures can be applied.

Suppose the limited or reduced sized soft buffer 1040 of a receiving communication device (e.g., UE) is sufficiently large to store $N_1$ soft information values (e.g., $N_1$ LLRs).

The total number of $N_1$ locations can be divided down to a predetermined number X of sub-banks (e.g., use X=16 sub-banks for illustration in this embodiment, though the reader will appreciate that other values of X may be employed without departing from the scope and spirit of the invention). In this example, each sub-bank can then save $N_1/X$ (or $N_1/16$ in example) soft information symbols (e.g., LLRs). Considering X=16, let us order the received transport blocks (TBs) as 16 separate TBs as indicated by TB(1), TB(2), . . . , TB(16). Then the receiving communication device (e.g., UE) can use one of the following ways to store soft information symbols (LLRs).

If TB(i) does not pass CRC, then the selection of a subset of the LLRs involves selecting and saving the first $N_1/X$ (or $N_1/16$ in example) soft information symbols into i-th sub-bank; otherwise leave that particular i-th sub-bank empty.

In an alternative embodiment, if TB(i) does not pass CRC, then based on some optimal sub-rate matching method may be employed to select $N_1/X$ (or $N_1/16$ in example) soft information symbols (LLRs) to save into i-th sub-bank; otherwise leave i-th sub-bank empty.

Figure 11:
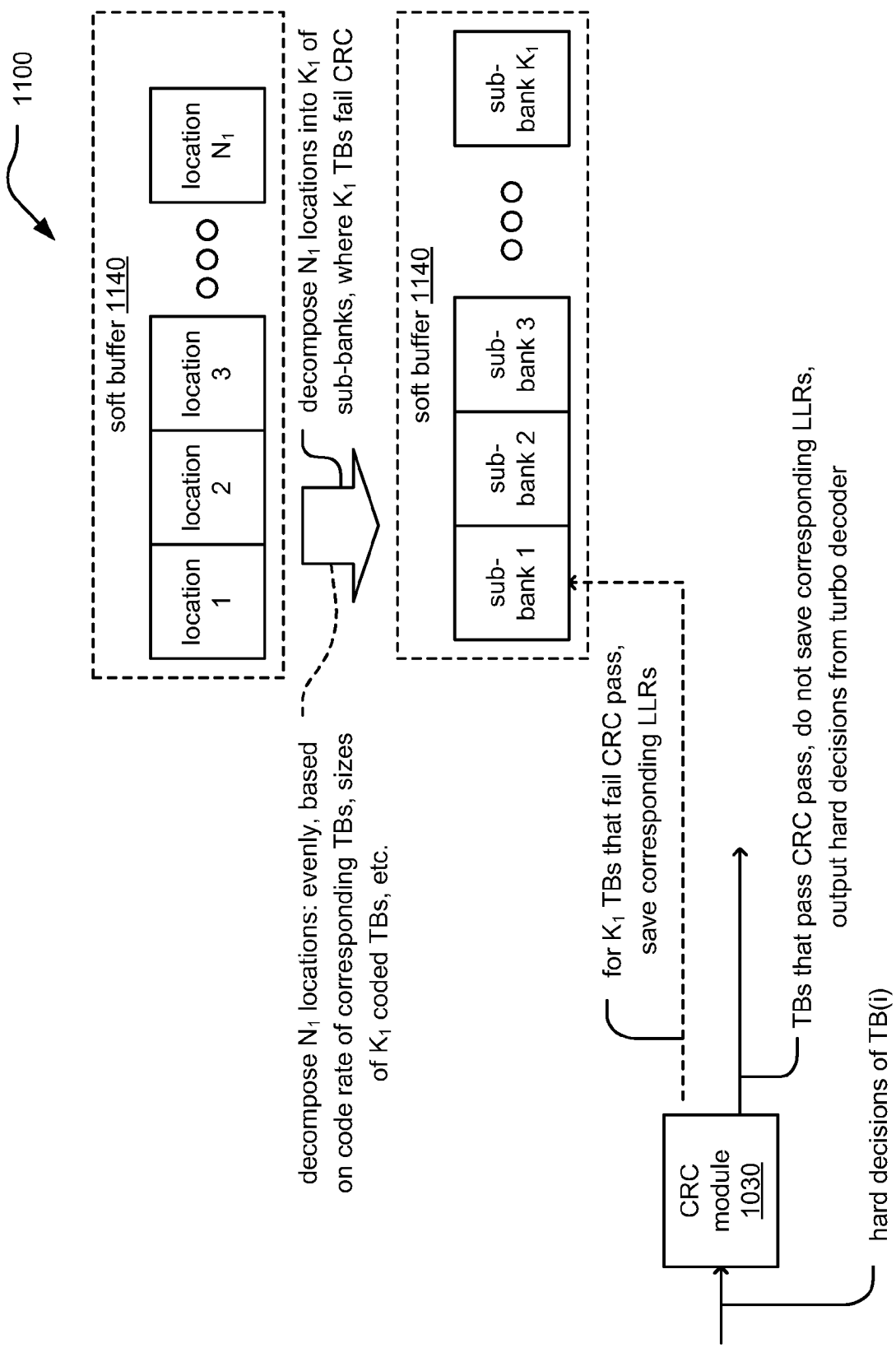
FIG. 11 illustrates an alternative embodiment of allocating a relatively small sized memory device for storing of soft information (e.g., LLRs).

FIG. 11 illustrates an alternative embodiment 1100 of allocating a relatively small sized memory device for storing of soft information (e.g., LLRs). In this instance, if only $K_1$ transport blocks (TBs) have not passed the TB CRC, then soft buffer 1140 may be divided down to $N_1$ locations to $K_1$ separate sub-banks (i.e., $K_1$ is number of failed TBs). There may be several ways to decompose the $N_1$ locations, namely, evenly decompose, decompose based on code rates of TBs, decompose based on the sizes of $K_1$ coded TBs, etc.

Here, we may denote the sub-bank sizes to be $N_{1,1}, \ldots, N_{1,K_1}$. This decomposition may be virtual (i.e., it need not a hard partitioning of memory within the soft buffer 1140, but merely a virtual partitioning). In an actual hardware implementation, there is therefore only a need to save or to mark some addresses and record the size of the $K_1$ sub-banks. After that the receiving communication device (e.g., UE) can save the $K_1$ TB soft information streams (LLRs), it may then use either a) save the first $N_{1,i}$ soft information symbols (LLRs) into i-th sub-bank (e.g., first consecutive first $N_{1,i}$ soft information symbols (LLRs)) or b) employ some other optimal sub-rate matching method to select the subset of LLRs ($N_{1,i}$ soft information symbols) to be saves into i-th sub-bank of the soft buffer 1140.

Figure 12:
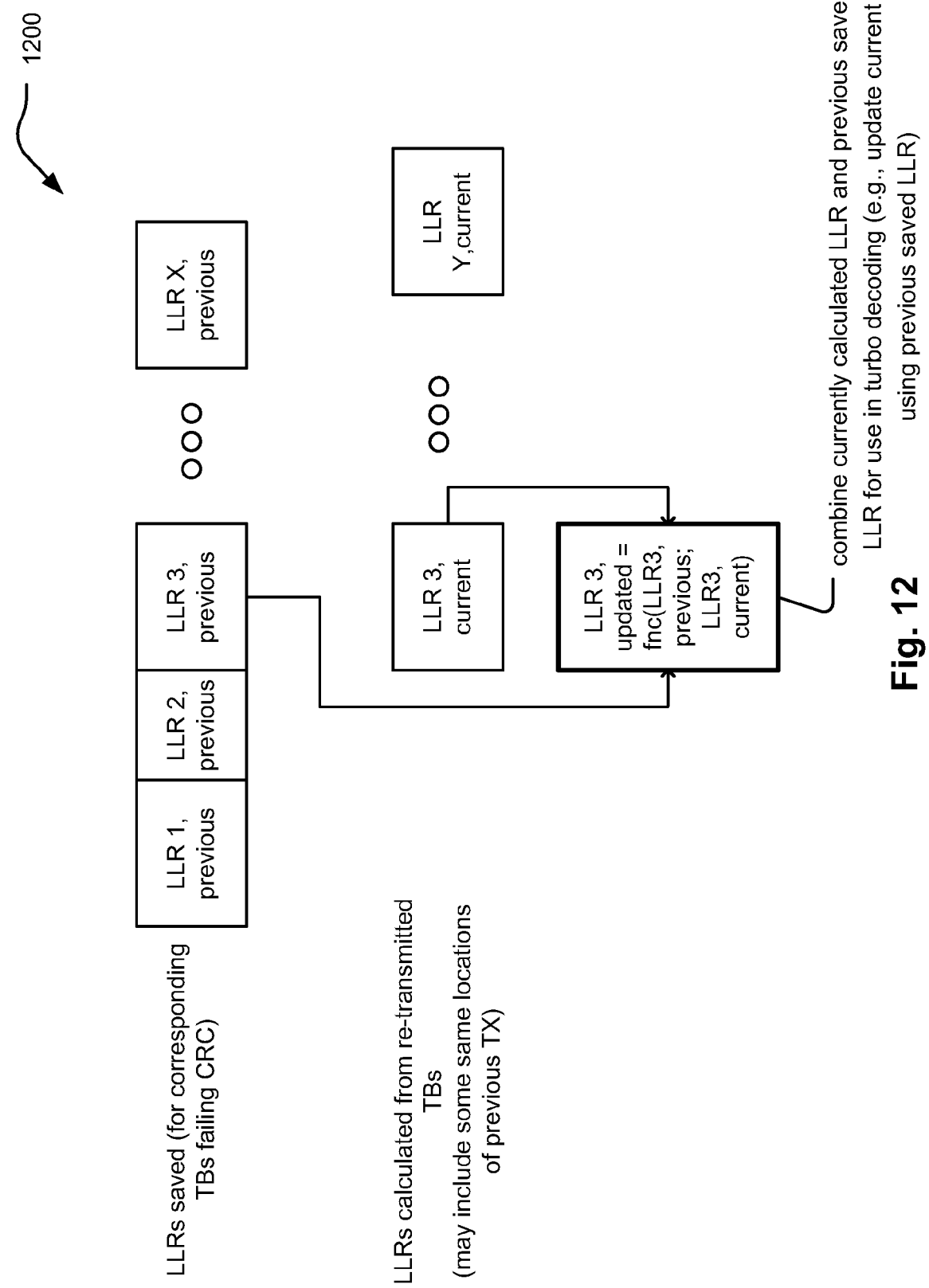
FIG. 12 illustrates an embodiment of combination of previously calculated soft information with currently calculated soft information for use in decoding.

FIG. 12 illustrates an embodiment 1200 of combination of previously calculated soft information with currently calculated soft information for use in decoding. In accordance with incremental redundancy, there may be instances in which $K_1$ TBs may require re-transmission. In contradistinction to the 2 stage rate matching methods mentioned above, the proposed novel rate matching approach does not limit the number of the coded bits being transmitted from a transmitting communication device (e.g., eNode B).

For example, the transmitting communication device (e.g., eNode B) may follow the rate matching approach, RV (redundancy version) and CQI to send out all or some of the coded bits to the receiving communication device (e.g., UE).

After calculating the soft information symbols (LLRs) of the received symbols from current re-transmission, the receiving communication device (e.g., UE) then may selectively combine some of just-calculated soft information symbols (LLRs) from the currently received transmission (e.g., shown as LLR 3, current; . . . up to LLR Y, current) with those soft information symbols (LLRs) from a previous transmission that have been selectively stored in the soft buffer (e.g., shown as LLR 1, previous; LLR 2, previous; LLR 3, previous, . . . up to LLR X, previous) using some desired function. In some instances, the function involves merely adding the previous and current values together to generate the corresponding LLR value to be used in decoding. For example, in one embodiment, the LLR 3, previous may be combined with LLR 3, current to generate LLR 3, updated, and the value LLR 3, updated is the one used in decoding. Alternatively, in another embodiment, the LLR 3, previous may be added to LLR 3, current to generate LLR 3, updated, and the value LLR 3, updated is the one used in decoding.

In some embodiments, the combining procedure is trivial since the re-transmitted $K_1$ TBs are those TBs with soft information symbols (LLRs) saved in the soft buffer. Therefore, the receiving communication device (e.g., UE) just needs to combine both the currently computed soft information symbol (LLR) and the previous saved one located in the soft buffer (e.g., consider LLR 3 previously stored, then computed again based on a second transmission as shown in the diagram).

In certain embodiments, some of soft information symbols (LLRs) come from locations that have not been sent previously (e.g., consider LLR Y in diagram) or have not been saved in the reduced soft buffer. Those soft information symbols (LLRs) can nevertheless be used in decoding. The combined soft information symbols together with some newly computed but non-combined soft information symbols will then be sent to turbo decoder. This will inherently provide a significant error correction capability advantage using the novel rate matching approach presented herein. This novel rate matching approach relies more on IR (incremental redundancy) than Chase combining, and it is well known that IR outperforms Chase combining.

Similar to what has been described above, after turbo decoding of re-transmitted TBs is performed, the number $K_2$ of failed TBs will typically be far less than that of re-transmitted TBs $K_1$ defined previously. Then the receiving communication device (e.g., UE) can use the same approaches and methods described above to store the combined or updated LLR and non-combined LLR to in the reduced or limited sized soft buffer. Obviously, in this instance (e.g., corresponding to a subsequent transmission), the number of soft information symbols (LLRs) of every CTB that can to be saved in the soft buffer is relatively larger than the number allowed in a previous transmission. This is yet another advantage of the novel rate matching approach presented herein when compared to the 2 stage rate matching.

After saving the soft information symbols (LLR) into the soft buffer, the receiving communication device (e.g., UE) will call a NACK. After another re-transmission, the receiving communication device (e.g., UE) will repeat procedure presented above with regard to incremental redundancy and also described just above until all TBs are successfully received or the system exhausts the HARQ limitation defined for the receiving communication device (e.g., UE).

Figure 13:
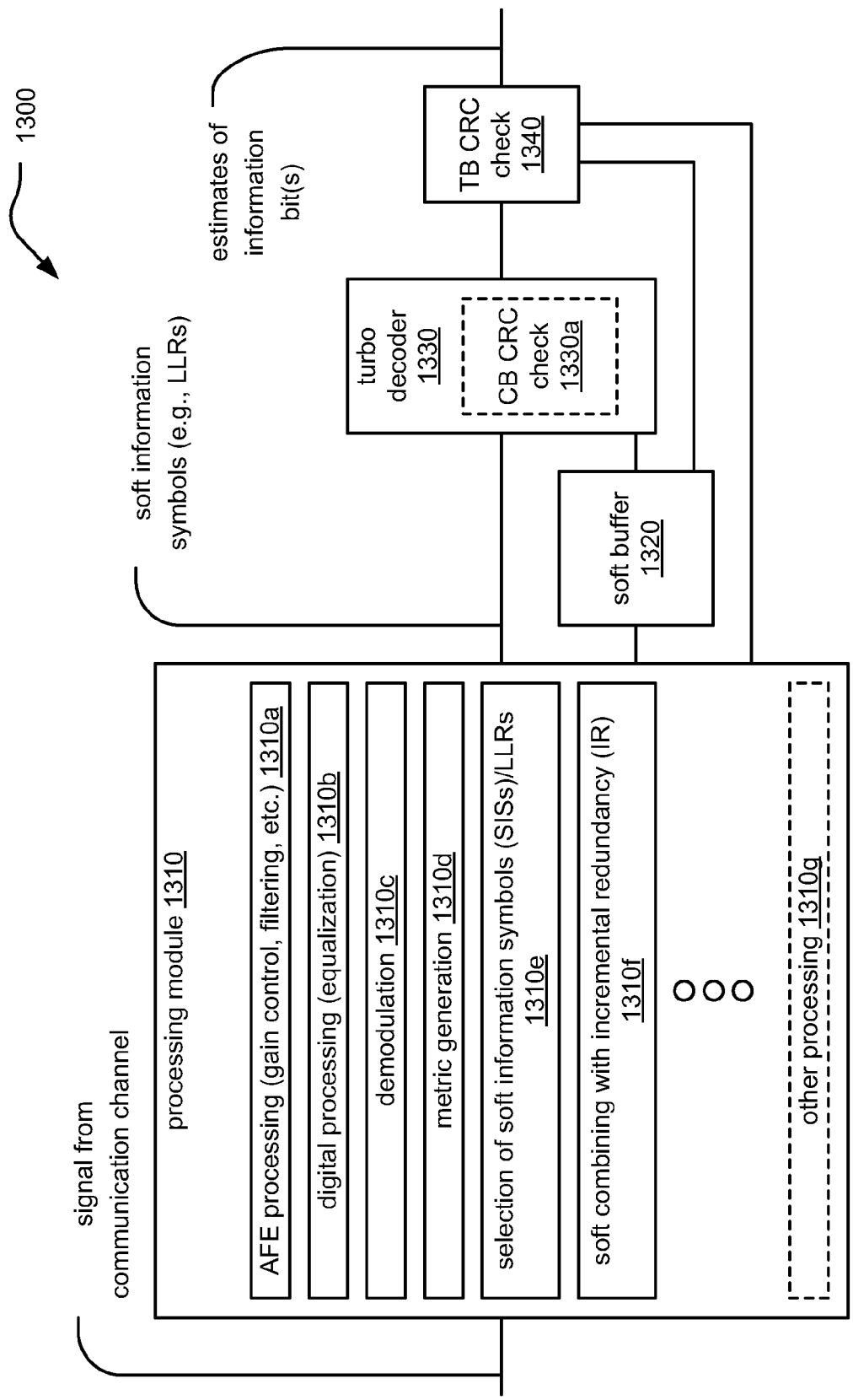
FIG. 13 illustrates an embodiment of a communication device that includes a soft buffer for use in performing at least turbo decoding and cyclic redundancy check (CRC) checking processing of a received signal.

FIG. 13 illustrates an embodiment of a communication device 1300 that includes a soft buffer for use in performing at least turbo decoding and cyclic redundancy check (CRC) checking processing of a received signal.

A signal (e.g., that has undergone cyclic redundancy check (CRC) and turbo encoding) is received via a communication channel. The communication device 1300 includes a processing module 1310 that is operable to perform any a wide variety of operations including the generation of soft information symbols (SISs)/LLRs. The processing module 1310 can be coupled to an external memory that is operable to store operational instructions that enable the processing module to perform these various operations. Alternatively, the processing module 1310 can include an embedded/integrated memory that is operable to store operational instructions that enable the processing module to perform these various operations. In some embodiments, these SISs may be referred as log likelihood ratios (LLRs). Alternatively, other forms of soft information can also be employed.

The processing module 1310 may be implemented and operable to perform analog front end (AFE) processing 1310*a* that may include gain control, filleting, etc. The processing module 1310 may also be implemented and operable to perform digital processing 1310*b* that may include equalization. Other operations such as demodulation 1310*c*, metric generation 1310*d*, selection of soft information symbols (SISs)/LLRs 1310*e*, soft combining with incremental redundancy (IR) 1310*f*, and/or other processing operations may also be performed by the processing module 1310.

The soft information symbols are provided from the processing module 1310 to a turbo decoder 1330. Also, these soft information symbols may be provided from the processing module 1310 to a soft buffer 1320, and previous values of soft information symbols stored in the soft buffer 1320 may be provided back to the processing module 1320 as well.

For example, there are embodiments describes below where previous values of soft information symbols are employed to be combined with currently calculated values of soft information symbols to generate updated soft information symbols. Any of a variety of means of performing this combination/updating of soft information symbols can be performed (e.g., averaging, weighted averaging, adding, etc.).

It is noted that the turbo decoder 1330 is operable to perform CRC check 1330*a* on the individual turbo code blocks (CBs) within the received signal. Also, a subsequent CRC check (i.e., a TB CRC check 1340) may be performed to make a CRC check on the entire transport block (TB) within the received signal. In other words, there may be two layers of CRC employed (e.g., one for each respective CB, and one for the entire TB that includes multiple CBs therein). Information corresponding to one or either of these CRCs can be employed when determining the manner by which soft information symbols are to be stored within the soft buffer 1320 as well as which particular soft information symbols are to be stored within the soft buffer 1320.

The output of the TB CRC check module 1340 includes estimates of information bits.

Figure 14:
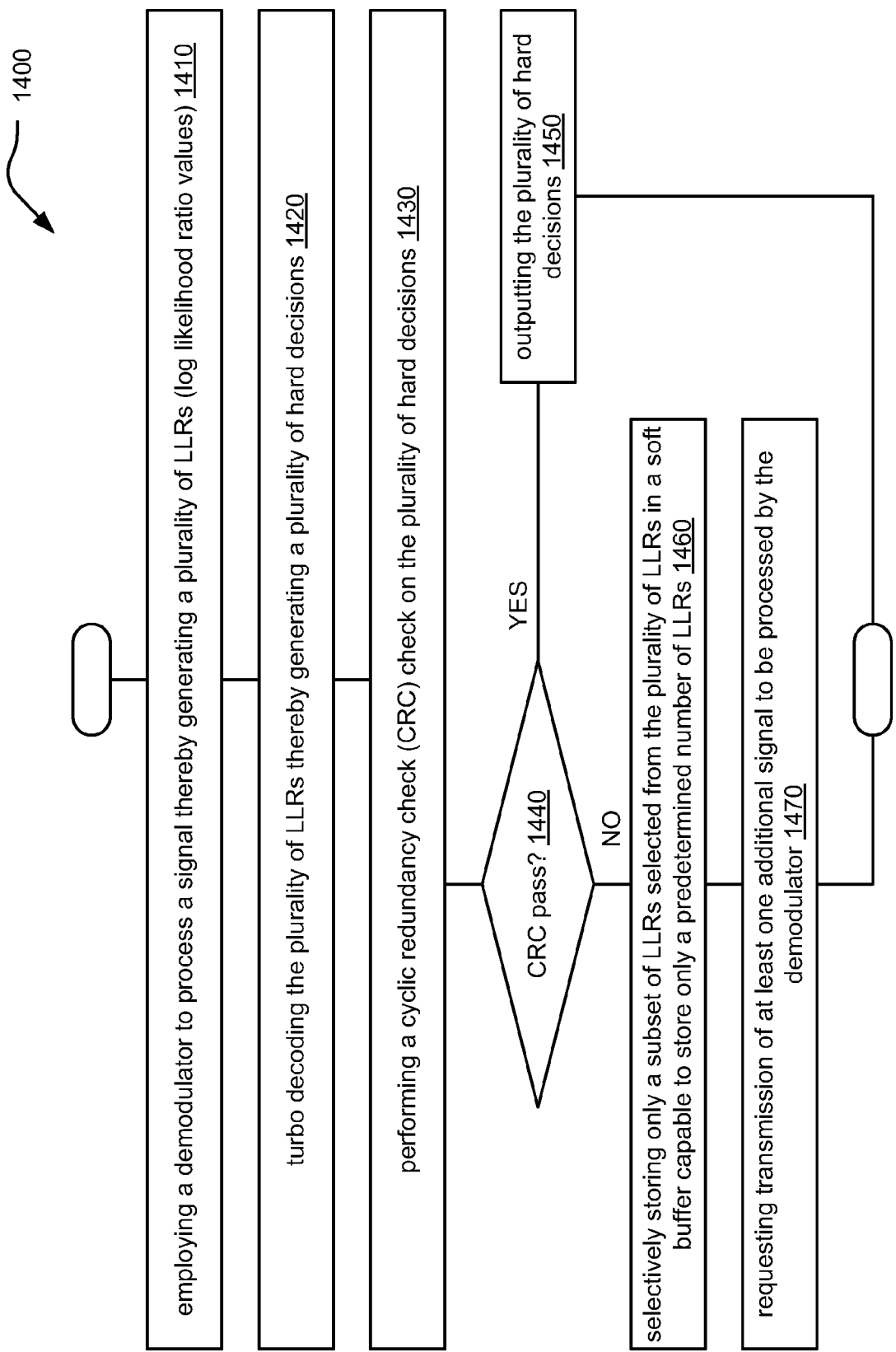
FIG. 14 illustrates an embodiment of a method for performing rate matching.

FIG. 14 illustrates an embodiment of a method 1400 for performing rate matching. The method 1400 begins by employing a demodulator to process a signal thereby generating a plurality of LLRs (log likelihood ratio values), as shown in a block 1410. Then, as shown in a block 1420, the method 1400 continues by turbo decoding the plurality of LLRs thereby generating a plurality of hard decisions. As will be understood by the reader having understanding of turbo coding (e.g., including encoding and decoding) turbo decoding can be effectuated in a variety of ways including employing one or more of a soft-in/soft-out (SISO) decoding module, extrinsic calculation module, interleaver, de-interleaver, etc. during each decoding iteration in this embodiment, the latest calculates soft information (e.g., extrinsic information) undergoes hard limiting to make actual hard decisions (e.g., hard estimates of any information bits encoded within the signal).

Then, based on the hard decisions calculated during a particular decoding iteration, the method 1400 operates by performing a cyclic redundancy check (CRC) check on the plurality of hard decisions. As mentioned above in other embodiments, an information block (e.g., alternatively referred to as a turbo block) about to undergo turbo encoding may firstly undergo CRC encoding to generate corresponding CRC bits. In such an instance, the now modified information block (including the CRC bits, which may be appended to the information block) then undergoes turbo encoding. In such a case, the CRC check of the block 1430 may be another level of scrutiny to determine if the hard decisions calculated in the block 1420 are accurate.

When the CRC check passes, the method 1400 operates by outputting the plurality of hard decisions, as shown in a block 1450. However, when the CRC check fails, the method 1400 can perform different operations. The method 1400 operates by selectively storing only a subset of LLRs selected from the plurality of LLRs in a soft buffer capable to store only a predetermined number of LLRs, as shown in a block 1460. Again, this does not involve storing all of the LLRs calculated in the block 1410, but only a subset of those calculated LLRs. A communication device may include only a relatively small sized memory and may not have sufficient space to store all of the LLRs, so a selected subset of them is selected for being stored and used in at least one subsequent decoding iteration when the CRC check fails. In addition, the method 1400 can operate by requesting transmission of at least one additional signal to be processed by the demodulator, as shown in a block 1470. For example, in an embodiment when the method 1400 is performed within a first communication device, the first communication device can operate by requesting transmission of at least one additional signal to be sent to it by a second communication device so that it may also be processed by the demodulator.

There are a variety of ways in which the subset of LLRs can be determined. For example, the method 1400 can operate by selecting the subset of LLRs from the plurality of LLRs in accordance with a predetermined, non-consecutive pattern. Alternatively, the subset of LLRs may be a subset of consecutive LLRs within the plurality of LLRs (e.g., the first X number of LLRs within the entire plurality of LLRs calculated in the block 1410). Clearly, any other desired means may also be performed without departing from the scope and spirit of the invention.

The method 1400 may be performed in a wide variety of communication devices, including those that may be implemented within any one of a satellite communication system, a wireless communication system, a wired communication system, and/or a fiber-optic communication system. Clearly, certain communication system types may include some satellite components, some wired components, some wireless components, some fiber-optic or optical components, etc., and the method 1400 may be performed within any such combination type communication system as well including any of those depicted and described with reference to FIG. 1.

It is noted that the various modules (e.g., encoding modules, decoding modules, etc.) described herein may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

REFERENCES

[1] 3GPP TS 36.212 v8, "Multiplexing and Channel Coding (Release 8)," 2007.

[2] 3GPP TS 25.212 v7.6.0, "Multiplexing and Channel Coding (Release 7)," 2007.

[3] R1-073470, Fujitsu, "Adoption of 2 stage rate matching and modified IR HARQ", RAN1#50, Athens, Greece, August, 2007.

[4] R1-074566, Motorola, "On Supporting 1st stage Turbo Code Rate Matching", RAN1#51, Jeju, Korea, 5-9 Nov. 2007.

[5] R1-075091, Ericsson, "On Supporting two stage Rate Matching", RAN1#51, Jeju, Korea, 5-9 Nov. 2007.

[6] R1-075094 (R1-075106), "Proposal for limited buffer rate matching", RAN1#51, Jeju, Korea, 5-9 Nov. 2007.

What is claimed is:

1. An apparatus, comprising:
a demodulator that processes a signal thereby generating a plurality of LLRs (log likelihood ratio values);
a turbo decoder that processes the plurality of LLRs thereby generating a plurality of hard decisions;
a cyclic redundancy check (CRC) module that performs a CRC check on the plurality of hard decisions;
a soft buffer, capable to store only a predetermined number of LLRs, that selectively stores only a subset of LLRs selected from the plurality of LLRs when the CRC check fails; and wherein:
when the CRC check passes, the turbo decoder outputs the plurality of hard decisions.

2. The apparatus of claim 1, wherein:
the signal is transmitted from at least one additional apparatus to the apparatus via a communication channel;
when the CRC check fails:
the apparatus requests transmission of at least one additional signal from the at least one additional apparatus to the apparatus;
the demodulator processes the at least one additional signal thereby generating at least one additional plurality of LLRs; and
the turbo decoder processes the at least one additional plurality of LLRs thereby generating at least one additional plurality of hard decisions.

3. The apparatus of claim 1, wherein:
the signal is transmitted from at least one additional apparatus to the apparatus via a communication channel;
when the CRC check fails:
the apparatus requests transmission of at least one additional signal from the at least one additional apparatus to the apparatus;
the demodulator processes the at least one additional signal thereby generating at least one additional plurality of LLRs; and
the at least one additional plurality of LLRs and the plurality of LLRs each include a different number of LLRs.

4. The apparatus of claim 1, further comprising:
an LLR combining module; and wherein:
the signal is transmitted from at least one additional apparatus to the apparatus via a communication channel;
when the CRC check fails:
the apparatus requests transmission of at least one additional signal from the at least one additional apparatus to the apparatus;
the demodulator processes the at least one additional signal thereby generating at least one additional plurality of LLRs; and
the LLR combining module updates at least one LLR of the at least one additional plurality of LLRs using at least one LLR of the plurality of LLRs;
the turbo decoder processes the at least one additional plurality of LLRs thereby re-generating the plurality of hard decisions.

5. The apparatus of claim 4, wherein:
the LLR combining module adds the at least one LLR of the at least one additional plurality of LLRs to the at least one LLR of the plurality of LLRs.

6. The apparatus of claim 1, further comprising:
an LLR selection module that selects the subset of LLRs from the plurality of LLRs; and wherein:

the subset of LLRs is a subset of consecutive LLRs within the plurality of LLRs.

7. The apparatus of claim 1, further comprising:
an LLR selection module that selects the subset of LLRs from the plurality of LLRs in accordance with a predetermined, non-consecutive pattern.

8. The apparatus of claim 1, wherein:
the signal is transmitted from at least one additional apparatus to the apparatus via a communication channel;
the at least one additional apparatus includes a turbo encoder, a transmission module, and a modulator;
the turbo encoder encodes a plurality of information bits, wherein the plurality of information bits and the plurality of parity bits form a codeword;
the transmission module forms a first transmission block from selected bits of the codeword; and
the modulator processes the first transmission block thereby generating the signal.

9. The apparatus of claim 1, wherein:
the apparatus is a transceiver or a receiver.

10. The apparatus of claim 1, wherein:
the apparatus is a communication device; and
the communication device is implemented within at least one of a satellite communication system, a wireless communication system, a wired communication system, and a fiber-optic communication system.

11. An apparatus, comprising:
a demodulator that processes a first signal, transmitted from at least one additional apparatus via a communication channel, thereby generating a plurality of LLRs (log likelihood ratio values);
a turbo decoder that processes the first plurality of LLRs thereby generating a plurality of hard decisions;
a cyclic redundancy check (CRC) module that performs a first CRC check on the plurality of hard decisions;
a soft buffer, capable to store only a predetermined number of LLRs, that selectively stores only a subset of LLRs selected from the first plurality of LLRs when the first CRC check fails; and wherein:
when the first CRC check fails:
  the apparatus requests transmission of a second signal from the at least one additional apparatus to the apparatus;
  the demodulator processes the second signal thereby generating a second plurality of LLRs;
  at least one LLR of the second plurality of LLRs is updated using at least one LLR of the first plurality of LLRs;
  the turbo decoder processes the second plurality of LLRs, including the updated LLR therein, thereby re-generating the plurality of hard decisions;
  the CRC module performs a second CRC check on the re-generated plurality of hard decisions;
when the second CRC check passes, the turbo decoder outputs the re-generated plurality of hard decisions;
when the second CRC check fails:
  the apparatus requests transmission of a third signal from the at least one additional apparatus to the apparatus;
  the demodulator processes the third signal thereby generating a third plurality of LLRs; and
  the turbo decoder processes the third plurality of LLRs thereby generating at least one additional plurality of hard decisions.

12. The apparatus of claim 11, wherein:
when the second CRC check fails, the soft buffer selectively stores only a subset of LLRs selected from the second plurality of LLRs;
at least one LLR of the third plurality of LLRs is updated using at least one LLR of the first plurality of LLRs or the second plurality of LLRs; and
the turbo decoder processes the third plurality of LLRs, including the updated LLR therein, thereby re-generating the plurality of hard decisions.

13. The apparatus of claim 11, further comprising:
an LLR selection module that selects the subset of LLRs from the first plurality of LLRs; and wherein:
the subset of LLRs from the first plurality of LLRs is a subset of consecutive LLRs within the first plurality of LLRs.

14. The apparatus of claim 11, further comprising:
an LLR selection module that selects the subset of LLRs from the first plurality of LLRs in accordance with a predetermined, non-consecutive pattern.

15. The apparatus of claim 11, wherein:
the apparatus is a transceiver or a receiver.

16. The apparatus of claim 11, wherein:
the apparatus is a communication device; and
the communication device is implemented within at least one of a satellite communication system, a wireless communication system, a wired communication system, and a fiber-optic communication system.

17. A method, comprising:
employing a demodulator to process a signal thereby generating a plurality of LLRs (log likelihood ratio values);
turbo decoding the plurality of LLRs thereby generating a plurality of hard decisions;
performing a cyclic redundancy check (CRC) check on the plurality of hard decisions;
when the CRC check passes, outputting the plurality of hard decisions; and
when the CRC check fails:
  selectively storing only a subset of LLRs selected from the plurality of LLRs in a soft buffer capable to store only a predetermined number of LLRs; and
  requesting transmission of at least one additional signal to be processed by the demodulator.

18. The method of claim 17, wherein:
the subset of LLRs is a subset of consecutive LLRs within the plurality of LLRs.

19. The method of claim 17, further comprising:
selecting the subset of LLRs from the plurality of LLRs in accordance with a predetermined, non-consecutive pattern.

20. The method of claim 17, wherein:
the method is performed in a communication device; and
the communication device is implemented within at least one of a satellite communication system, a wireless communication system, a wired communication system, and a fiber-optic communication system.

* * * * *